United States Patent
Adachi

[11] Patent Number: 5,117,280
[45] Date of Patent: May 26, 1992

[54] PLASTIC PACKAGE SEMICONDUCTOR DEVICE WITH THERMAL STRESS RESISTANT STRUCTURE

[75] Inventor: Takao Adachi, Tokyo, Japan

[73] Assignee: NEC Corporation, Tokyo, Japan

[21] Appl. No.: 550,848

[22] Filed: Jul. 10, 1990

[30] Foreign Application Priority Data

Jul. 10, 1989 [JP] Japan .................................. 1-177439

[51] Int. Cl.[5] ..................... H01L 23/28; H01L 23/48; H01L 29/44; H01L 29/52
[52] U.S. Cl. ....................................... 357/72; 357/68; 357/70; 357/71
[58] Field of Search ........................ 357/72, 71, 70, 68

[56] References Cited

U.S. PATENT DOCUMENTS

| | | | |
|---|---|---|---|
| 4,884,123 | 11/1989 | Dixit | 357/71 |
| 4,916,521 | 4/1990 | Yoshikawa et al. | 357/71 |
| 4,970,574 | 11/1990 | Tsunenari | 357/71 |

Primary Examiner—Rolf Hille
Assistant Examiner—David Ostrowski
Attorney, Agent, or Firm—Sughrue, Mion, Zinn, Macpeak & Seas

[57] ABSTRACT

A wiring formed in the uppermost level of a plastic encapsulated semiconductor device is fixed by connecting it to anchor wirings provided in a lower level via through holes in order to suppress a shear deformation of the uppermost level wiring. The independent wirings are formed in an islandshaped pattern and have no electrical connection to any circuit elements per se.

7 Claims, 2 Drawing Sheets

PLASTIC PACKAGE SEMICONDUCTOR DEVICE WITH THERMAL STRESS RESISTANT STRUCTURE

BACKGROUND OF THE INVENTION

The present invention relates to a semiconductor device, and more particularly to a resin sealed semiconductor device.

A resin sealed semiconductor device is ordinarily assembled by mounting on a lead frame a semiconductor element which has circuit elements formed thereon, connecting the electrodes of the semiconductor element and the leads of the lead frame with bonding wires and sealing the semiconductor element and wires with a resin member. Accordingly, a resin sealed semiconductor device is constructed having components that may be roughly divided into an epoxy resin member which is a sealing material, a silicon substrate with circuit elements formed thereon and a metallic lead frame on which is mounted a silicon substrate. Since the coefficients of thremal expansion of these materials are mutually different, thermal stresses are generated at the respective boundaries of the epoxy resin member, the silicon substrate and the lead frame due to expansion or contraction that occurs due to changes in the temperature. In particular components of the circuit elements that are constructed on the silicon substrate surface are sometimes broken by stresses that act on the surface of the silicon substrate, resulting in non-use of the semiconductor device. For this reason, a temperature cycling test is usually undertaken in order to confirm whether the semiconductor device can withstand changes in the temperature.

The above-mentioned breaking phenomenon of components of the circuit elements will now be described in more detail.

During wire bonding, a bonding ball is formed at a part of the wire that is connected to a bonding pad on the silicon substrate. The bonding ball is given a shape that protrudes from the upper surface of the silicon substrate so that it is subjected most severely to the influence of the stresses in the epoxy resin when a temperature change takes place. As a result the bonding pad which is connected to the bonding ball suffers from large stresses. Of particular concern is the component of the stresses that acts in the direction parallel to the substrate surface, which generates a shear in the bonding pad and creates a change in its shape. The deformation thus created is spread to the circuit element of the output buffer circuit via a leader line which is connected to the bonding pad. Since the tip of the leader line is connected via contacts to a diffused layer on the silicon substrate, the spreading deformation in the leader line acts on the contacts as a concentration of stresses. When the contacts can no longer withstand the stress concentration, the lead line is broken. Further, the stress concentration cause pressure on the wirings which are on a level lower than that of the lead line, thus causing disconnections of the lower level wirings.

The conventional countermeasures to the above mentioned problems are as follows. Firstly, a resin with a coefficient of expansion made to match that of silicon is employed. This is obtained by blending various kinds of fillers with a resin, such as epoxy resin, which has a coefficient of thermal expansion close to that of silicon. Secondly, the width of the wirings in the portion receiving large stresses is increased, or the spacing between the wirings is increased.

However, with regard to the first countermeasure, the sealing resin having a coefficient of expansion made to match that of silicon has an inferior moisture resistance creating a separate problem that the moisture resistance of the semiconductor device is deteriorated. In the second countermeasure, the effort to improve the integration density of the semiconductor device is obstructed, its electrical capacitance increased, and the operating speed is reduced.

BRIEF SUMMARY OF THE INVENTION

It is a first object of the present invention to provide a semiconductor device which is capable of withstanding thermal stresses generated by changes in the temperature.

It is a second object of the present invention to provide a resin sealed semiconductor device which uses a sealing resin having excellent moisture resistance, and is capable of withstanding the thermal stresses.

It is a third object of the present invention to provide a semiconductor device that can be fabricated according to the conventional fabrication process, and is capable of withstanding the tgermal stresses.

In the resin sealed semiconductor device in accordance with the present invention, at least a part, for example, a leader line, of the wirings on the uppermost level provided on the silicon substrate is connected to a lower level dummy wiring. The dummy wiring is not connected to other parts of the semiconductor device via a through hole formed on the part of an interlayer film directly beneath that part of the wiring under discussion as in the convertional structure.

The lower level dummy wiring plays the role of a stopper for stopping the etching of the through hole, at the time of through hole formation, and it can be formed at the same time as the formation of other wirings required for the construction of the circuit, so that there is no need for any special fabrication process for the provision of the dummy wiring. Moreover, the dummy wiring and the through hole act to hold back the leader line which tends to slip in the layer direction when a shear stress acts on the lead line due to the changes in the temperature. In other words, the dummy wiring and the through hole play the role of an anchor.

With the configuration as in the above, the same materials as in the prior art can be used for the fabrication of a semiconductor device, and moreover, it is possible to avoid the breaking of the wirings by providing a strength that can withstand thermal stresses when the device is subjected to the thermal stresses.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
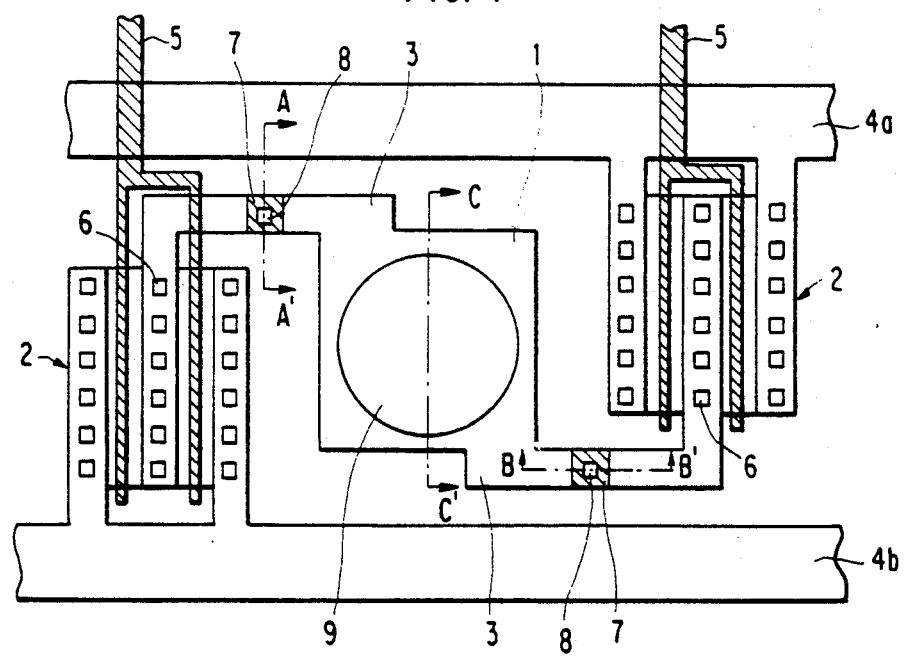
FIG. 1 is a through-vision plan view for a portion of a first embodiment of the semiconductor device according to the present invention in which circuit elements are formed on a silicon substrate.

Referring to FIG. 1, a resin sealed semiconductor device in accordance with the first embodiment of the present invention comprises a bonding pad 1 which is an uppermost level wiring layer, a circuit element (a group of MOS transistors) 2 which constitutes an output buffer circuit, a leader line 3 which is an upper level wiring layer that connects the bonding pad 1 and the circuit element 2, a power supply wiring 4a and a ground wiring 4b which are also uppermost level wiring layers, an input wiring 5 to the circuit element 2 and an independent, islandlike dummy wiring 7 which are lower level wiring layers that are provided beneath the uppermost level wirings via an insulating layer (12 of FIGS. 2 to 4), and a contact 6 provided in a diffused layer in the surface of the silicon substrate for connection to the uppermost level wiring layer.

A semiconductor element formed as in the above is mounted on a lead frame (not shown), bonding wires (not shown) are connected to the bonding pad 1, and then the device is resin sealed.

Figure 2:
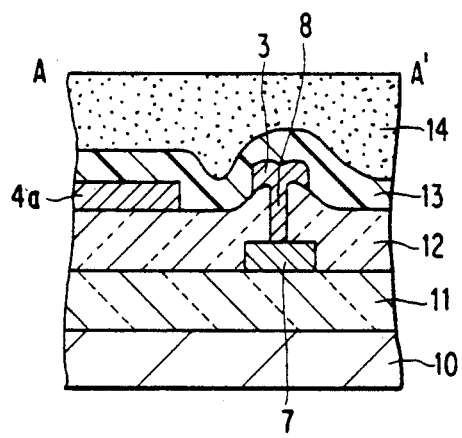
FIG. 2 is a sectional view showing an important part of the first embodiment of the present invention, being an enlarged vertical sectional view taken along the line A—A' in FIG. 1.
Figure 3:
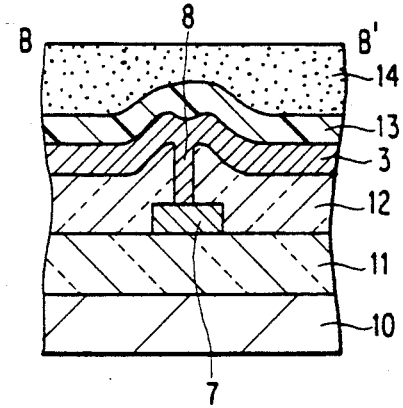
FIG. 3 is a sectional view showing an important part of the first embodiment of the present invention, being an enlarged vertical sectional view taken along the line B—B' in FIG. 1.
Figure 4:
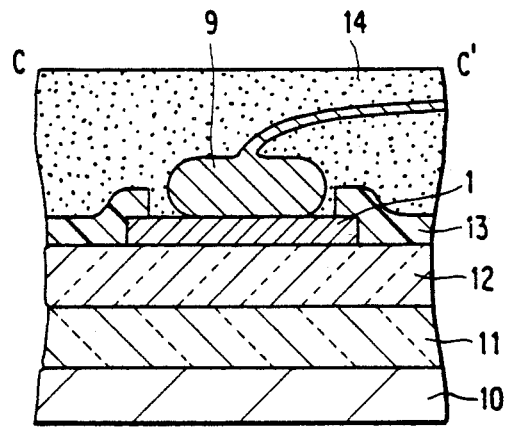
FIG. 4 is a sectional view showing an important part of the first embodiment of the present invention, being an enlarged vertical sectional view taken along the line C—C' in FIG. 1.

Next, making further reference to FIG. 2 to FIG. 4, the device will be described in more detail.

First, a 0.5 μm-thick first interlayer film 11 that uses phosphosilicate glass is formed on the silicon substrate with circuit elements 2 formed thereon. Next, input wirings 5 (see FIG. 1) and dummy wirings 7 (see FIGS. 1 to 3) are formed to a thickness of 0.4 μm using polycrystalline silicon on the first interlayer film 11. The dummy wiring 7 is formed at a position directly beneath the lead line 3, but it is not connected to other lower level wiring layers. In other words, the dummy wiring 7 is an independent and islandlike metallic layer, with dimensions of 10 μm × 10 μm.

Next, a second interlayer film 12 is formed to a thickness of 1 μm so as to cover the lower level wiring layers 5 and 7 and the first interlayer film 11. Then, a through hole 8 with length and width respectively in the range of 1.5 to 2.0 μm is created by etching in the second interlayer film 12 formed on the dummy wiring 7. In this case, the dummy wiring 7 plays the role of a stopper which stops the etching of the through hole 8. The material for the second interlayer film 12 is the same as the material for the first interlayer film 11. Next, the lead lines 3, the bonding pad 1, the power supply wiring 4a and the ground wiring 4b are formed of aluminum to a thickness of 1 μm as the upper level wiring layers, on the through holes 8. In this case, the interior of each of the through holes 8 is simultaneously filled with aluminum so that the dummy wiring 7 and the lead line 3 are firmly bonded via the through hole 8. The width of the lead line 3 is set to 10 μm, and the dimensions of the bonding pad are set to 100 μm × 100 μm. Finally, the peripheral part of the bonding pad 1, the entirety of other upper level wiring layers 3, 4a and 4b and the second interlayer film 12 are coated with a passivation film 13 of silicon nitride or phosphosilicate glass. It should be noted that the presence of the passivation film 13 is not indicated in FIG. 1.

A semiconductor element formed as in the above is mounted on a lead frame (not shown), connected to external terminals, namely, leads (not shown) of the lead frame via the bonding ball 9, and is sealed with a resin number 14 (not indicated in FIG. 1) such as one of epoxy resin.

In the first embodiment described in the above, a deformation in the bonding ball is transmitted to each of the lead lines 3. Since, however, the dummy wiring 7 is connected to a halfway position of the lead line 3 via the through hole 8 so that a further spread of the deformation in the lead line 3 is arrested, with the through hole 8 and the dummy wiring 7 as an anchor. Consequently, damages to the contacts 6 and the input wiring 5 that lie beyond the dummy wiring 7 and the through hole 8 can be prevented. Moreover, even if the through hole 8 is broken due to its being unable to withstand the stress concentration, other parts of the device will not be affected by the breaking since the dummy wiring 7 is not electrically connected to these parts.

It should be noted that in the first embodiment there is formed a dummy wiring 7 and a through hole 8 for each leader line 3. However, a plurality of dummy wirings and through holes may be formed as needed. The dimensions of the dummy wiring suffices if they are at least larger than the dimensions of the through hole (for example, the dummy wiring may be a square with side larger than 3 μm). The sides of the square may be larger than 10 μm provided that the dummy wiring remains within a defined range and does not approach the lower level wirings in its surroundings. Moreover, the shape of the dummy wiring need not be square, and may be rectangular or bent.

Figure 5:
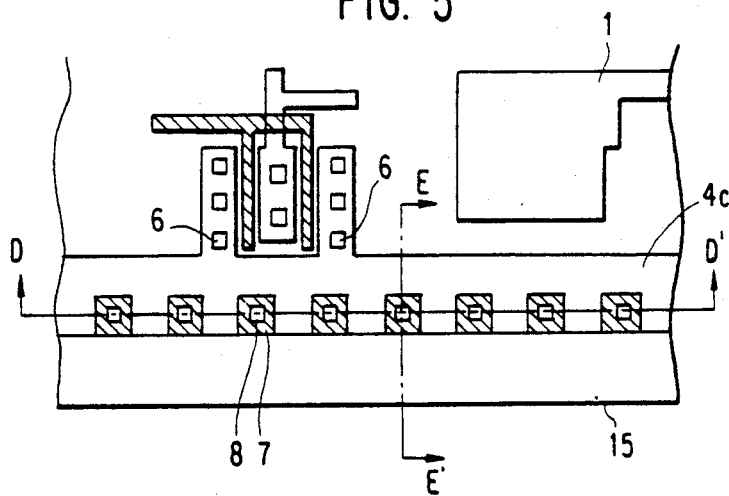
FIG. 5 is a through-vision plan view for a portion of a second embodiment of the semiconductor device according to the present invention in which circuit elements are formed on a silicon substrate.
Figure 6:
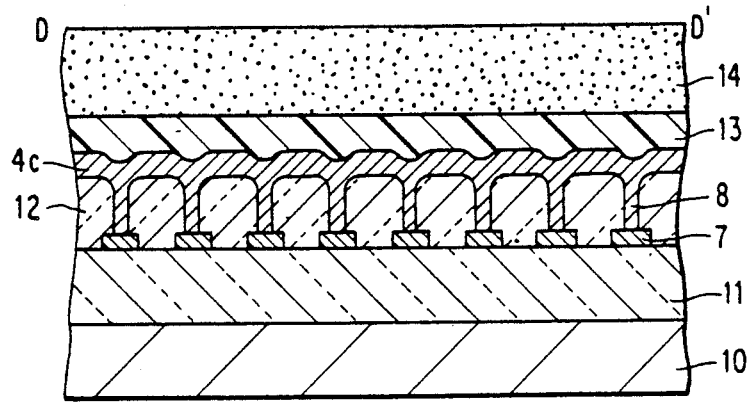
FIG. 6 is a sectional view showing an important part of the second embodiment of the present invention, being a vertical sectional view taken along the line D—D' in FIG. 5.
Figure 7:
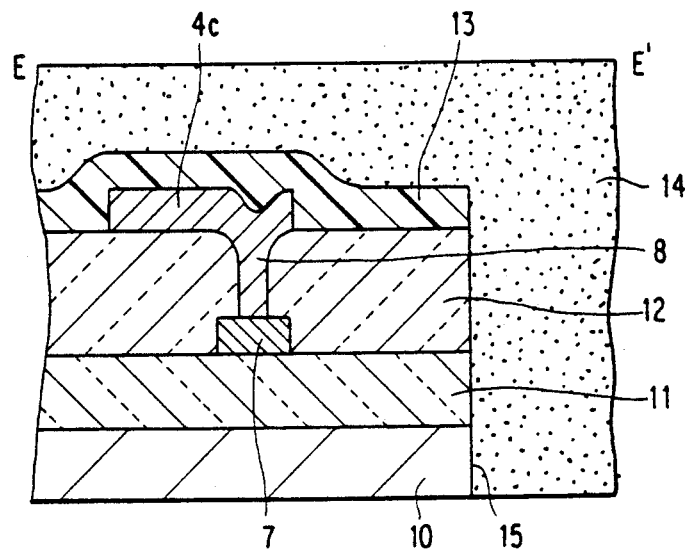
FIG. 7 is a sectional view showing an important part of the second embodiment of the present invention, being a vertical sectional view taken along the line E—E' in FIG. 5.

Next, referring to FIG. 5 to FIG. 7, a second embodiment of the present invention will be described. In these figures, the portions that are common to those of the first embodiment are shown with the identical reference numerals.

In the second embodiment, a large number of dummy wirings 7 which are lower level wirings are formed, and an outermost wiring 4c which is an upper level wiring is formed on top of them. Namely, the wiring 4c is formed so as to extend in the direction of the plurality of dummy wirings 7, where each dummy wiring 7 is connected to the outermost wiring 4c via a through hole 8.

The wiring 4c which is arranged at the outermost part of the semiconductor chip is an important wiring ordinarily used as a power supply wire or a ground wiring. However, the outermost wiring 4c is subjected to large thermal stresses in the sealing resin 14 that are generated by the changes in the temperature. However, deformation of the outermost wiring 4c is suppressed by the large number of dummy wirings 7 and the through holes 8 arranged in the periphery of the semiconductor chip acting as anchors and protecting the contacts 6 that are linked to these wirings.

A temperature cycling test is given to the semiconductor devices according to the two embodiments of the present invention described above. Namely, a semiconductor device with semiconductor chip area of 60 to 70 mm² is subjected to 300 temperature cyclings in one hour during which the temperature of the device is raised from −60° C. through room temperature to −150° C. and then lowered back to −60° C. in the reverse direction. A lot consisting of 20 to 50 pieces of the semiconductor devices is judged a defective lot if even one incidence of a disconnection defect is detected by the test.

As a result of the temperature cycling tests under the above-mentioned conditions, no defective lot consisted of the semiconductor devices fabricated according to the present invention, in contrast to the previous findings where practically all of the lots of the semiconductor devices that were not provided with the dummy wirings 7 were judged defective. A significant effect of the present invention can be expected for semiconductor devices with semiconductor chip sizes of larger than 140 mm² for which the effort to put them to practical use will be pursued in the future.

Since the semiconductor device of the present invention can be fabricated by the same process using the same materials as in the conventional semiconductor device, there is no need for modifying the coefficient of thermal expansion or changing the dimensions of the wiring on the semiconductor chip. As a result, it becomes possible to improve the yield strength to the temperature cycling without sacrificing the moisture resistance and the electrical characteristic of the semiconductor device.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments that fall within the true scope of the invention.

What is claimed is:

1. A semiconductor device which is attached on a lead frame member and sealed with a resin sealing member, comprising:
   a semiconductor substrate in which a plurality of circuit elements are formed;
   a first insulating layer on a main surface of said substrate;
   first wiring layers formed on the surface of said first insulating layer and electrically connected to said circuit elements;
   at least one independent wiring layer formed in an islandshaped pattern on the surface of said first insulating layer without connection to any of said first wiring layers and any of said circuit elements under said first insulating layer;
   a second insulating layer formed on said first insulating layer and covering said first wiring layers and said independent wiring layer and having at least one through hole exposing a part of the surface of said independent wiring layer;
   bonding pads formed on the surface of said second insulating layer; and
   a second wiring layer formed on the surface of said second insulating layer and having a first portion connected to one of said bonding pads directly and a second portion connected to said at least one independent wiring layer through said at least one through hole, said second portion being located relatively near said first portion and said second wiring layer being electrically connected to at least one of said circuit elements.

2. A semiconductor device comprising:
   a semiconductor silicon substrate with circuit elements formed thereon;
   a lead frame on which is mounted said silicon substrate;
   a resin member for sealing said silicon substrate;
   a first interlayer insulating film formed on said silicon substrate;
   an independent wiring formed on top of said first interlayer insulating film having no direct electrical connection to any of said circuit elements under said first interlayer insulating film,
   a second interlayer insulating film formed on top of said first interlayer insulating film and said independent wiring;
   a through hole formed in said second interlayer insulating film on top of said independent wiring;
   an upper wiring layer formed on top of said second interlayer insulating film; and
   a lower wiring layer formed between said first interlayer insulating film and said upper wiring layer; whereby
   at least a part of said upper wiring layer and said independent wiring being connected via said through hole; and
   said independent wiring being independent of said lower wiring layer.

3. The semiconductor device as claimed in claim 2, wherein said upper wiring layer is a head wire that connects a circuit element and a bonding pad formed on said second interlayer insulating film.

4. The semiconductor device as claimed in claim 2, wherein said upper wiring layer is a power supply wire or a ground wiring.

5. The semiconductor device as claimed in claim 2, wherein there are provided a plurality of independent wirings, with the respective wirings being connected to one upper wiring layer via the corresponding through holes.

6. The semiconductor device as claimed in claim 1, wherein a plurality of said independent wiring layers are connected to said second wiring layer through respective through holes.

7. The semiconductor device as claimed in claim 2, wherein said independent wiring and said lower wiring layer are formed of the same material.

* * * * *